United States Patent
Cho

(10) Patent No.: US 8,945,961 B2
(45) Date of Patent: Feb. 3, 2015

(54) ORGANIC LIGHT-EMITTING DISPLAY DEVICE AND METHOD OF MANUFACTURING THE SAME

(75) Inventor: Sung-Hwan Cho, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/585,501

(22) Filed: Aug. 14, 2012

(65) Prior Publication Data
US 2013/0153937 A1    Jun. 20, 2013

(30) Foreign Application Priority Data

Dec. 19, 2011    (KR) .................. 10-2011-0137408

(51) Int. Cl.
*H01L 51/50* (2006.01)

(52) U.S. Cl.
USPC ............. 438/34; 438/29; 438/30; 438/40; 438/48; 438/128; 438/82; 438/99; 438/725; 438/780

(58) Field of Classification Search
CPC ............... H01L 2924/12044; H01L 51/50
USPC ............ 257/88; 438/34, 29, 30, 48, 128, 158, 438/149, 609, 608, 153, 151, 54, 82, 99, 438/725, 780
See application file for complete search history.

(56) References Cited

U.S. PATENT DOCUMENTS

| | | | |
|---|---|---|---|
| 2002/0043941 A1 | 4/2002 | Iketsu et al. | |
| 2007/0063644 A1 | 3/2007 | Kim | |
| 2007/0153051 A1* | 7/2007 | Lee | 347/37 |
| 2008/0044585 A1 | 2/2008 | Suh et al. | |
| 2008/0266350 A1* | 10/2008 | Kim | 347/28 |
| 2010/0171105 A1* | 7/2010 | Kim et al. | 257/40 |
| 2010/0288860 A1 | 11/2010 | Inokuchi et al. | |

FOREIGN PATENT DOCUMENTS

| | | |
|---|---|---|
| JP | 2002-198174 | 7/2002 |
| JP | 2004-296227 | 10/2004 |
| KR | 10-2004-0061217 A | 7/2004 |
| KR | 10-2007-0032872 | 3/2007 |
| KR | 10-2008-0017124 | 2/2008 |
| KR | 10-2008-0042315 A | 5/2008 |
| KR | 10-2010-0103683 | 9/2010 |

* cited by examiner

*Primary Examiner* — Chuong A Luu

(74) *Attorney, Agent, or Firm* — Christie, Parker & Hale, LLP

(57) ABSTRACT

In an organic light-emitting display device and a method of manufacturing the organic light-emitting display device, the method includes forming thin film transistors (TFTs) on a substrate; and forming organic light emitting diodes (OLEDs), each of the OLEDs including a first electrode having a portion exposed by a pixel defining layer (PDL) on the TFTs, an organic layer on the exposed portion of the first electrode and including an emission layer (EML) configured to emit light having a respective one of a plurality of colors, and a second electrode on the organic layer. The EML is formed in each of a sub-pixel region with one color and other sub-pixel regions with other colors that are formed by forming openings in the PDL. A solution supply unit for sub-pixel region that communicates with the sub-pixel region with one color is formed in the sub-pixel region with one color.

18 Claims, 5 Drawing Sheets

ORGANIC LIGHT-EMITTING DISPLAY DEVICE AND METHOD OF MANUFACTURING THE SAME

CROSS-REFERENCE TO RELATED APPLICATION

This application claims priority to and the benefit of Korean Patent Application No. 10-2011-0137408, filed on Dec. 19, 2011, in the Korean Intellectual Property Office, the disclosure of which is incorporated herein in its entirety by reference.

BACKGROUND

1. Field

The present invention relates to an organic light-emitting display device, and a method of manufacturing the organic light-emitting display device.

2. Description of the Related Art

In general, organic light-emitting display devices may be applied to display devices for mobile apparatuses such as digital cameras, video cameras, camcorders, portable information terminals, smart phones, ultra-slim notebooks, tablet person computers, and flexible display apparatuses, or electronic/electric appliances such as ultra-slim televisions.

An organic light-emitting display device has a stack structure in which an emission layer (EML) is placed between an anode and a cathode. However, it is difficult to obtain high efficiency emission via the structure, thus, intermediate layers such as an electron injection layer (EIL), an electron transport layer (ETL), a hole transport layer (HTL), and a hole injection layer (HIL), and/or the like, may be selectively inserted between the anode and the cathode, and used.

In general, the organic light-emitting display device is manufactured by several methods such as a nozzle printing method, a deposition method, and the like. For example, the EML may be formed by the nozzle printing method, and the intermediate layers may be formed by the deposition method. In a case of using the deposition method, a solvent for the intermediate layers, e.g., a solvent of a solution for the HTL, may dissolve the EML in a deposition process, such that an interface characteristic may deteriorate. Also, by using both the nozzle printing method and the deposition method, the investment costs may be increased, a large space for equipments may be required, and it may be difficult or impossible to arrange in-line based equipment.

SUMMARY

Embodiments according to the present invention provide an organic light-emitting display device of which organic light emitting diodes (OLEDs) are manufactured by a solubility process using an electrostatic spraying method, and a method of manufacturing the organic light-emitting display device.

According to an aspect of embodiments according to the present invention, there is provided a method of manufacturing an organic light-emitting display device, the method including forming a plurality of thin film transistors (TFTs) on a substrate; and forming a plurality of organic light emitting diodes (OLEDs), each of the OLEDs including a first electrode having a portion exposed by a pixel defining layer (PDL) on the TFT, an organic layer on the exposed portion of the first electrode and including an emission layer (EML) configured to emit light having at least one of a plurality of colors, and a second electrode on the organic layer, wherein the EML is formed in each of a sub-pixel region with one color and other sub-pixel regions with other colors, from among a plurality of sub-pixel regions, the plurality of sub-pixel regions being formed by forming openings in the PDL, a solution supply unit that communicates with the sub-pixel region with one color is formed in the sub-pixel region with one color, and emission layer raw materials for the plurality of colors are supplied to the sub-pixel region with one color and the other sub-pixel regions with other colors via the solution supply unit, whereby the EML is formed.

At least one of the emission layer raw materials may be sprayed into the solution supply unit via a nozzle unit having a power applied thereto, and the at least one of the emission layer raw materials may move to the sub-pixel region that communicates with the solution supply unit, whereby the EML may be formed.

The EML may be formed by charging the at least one of the emission layer raw materials including a liquid emission layer raw material; and forming droplets by spraying the charged liquid emission layer raw material via the nozzle unit, and then forming the EML via the solution supply unit.

The charging the liquid emission layer raw material may include applying an electrical potential difference to the liquid emission layer raw material.

A positive voltage may be applied to the nozzle unit, whereby the liquid emission layer raw material may be positively charged and then may be sprayed via the nozzle unit, and the substrate may be electrically coupled to a ground voltage source.

The EML may include a first-color emission layer, a second-color emission layer, and a third-color emission layer, the first-color emission layer may be formed in a first sub-pixel region of the sub-pixel regions, and the first sub-pixel region may communicate with a first sub-pixel region solution supply unit, the second-color emission layer may be formed in a second sub-pixel region of the sub-pixel regions, and the second sub-pixel region may communicate with a second sub-pixel region solution supply unit for second sub-pixel region, the third-color emission layer may be formed in a third sub-pixel region of the sub-pixel regions, and a first-color emission layer raw material and a second-color emission layer raw material that are in a liquid state and are charged may be sprayed via the first sub-pixel region solution supply unit and the second sub-pixel region solution supply unit, respectively, may move to the first sub-pixel region and the second sub-pixel region, respectively, due to a repulsive force, and then may form the first-color emission layer and the second-color emission layer, respectively.

A plurality of the first sub-pixel regions, a plurality of the second sub-pixel regions, and a plurality of the third sub-pixel regions may be alternately formed along one direction of the substrate, the first sub-pixel region solution supply unit and the second sub-pixel region solution supply unit may be formed on side ends of the substrate, all of the plurality of the first sub-pixel regions may communicate with the first sub-pixel region solution supply unit, and all of the plurality of the second sub-pixel regions may communicate with the second sub-pixel region solution supply unit.

The first sub-pixel region solution supply unit and the second sub-pixel region solution supply unit may extend along one direction of the substrate, and the plurality of the first sub-pixel regions and the plurality of the second sub-pixel regions may be formed in a direction crossing the first sub-pixel region solution supply unit and the second sub-pixel region solution supply unit, respectively.

The spraying the first-color emission layer raw material and the second-color emission layer raw material may include: fixing the nozzle unit having a power applied thereto; and moving the substrate along one direction and concurrently spraying the first-color emission layer raw material and the second-color emission layer raw material, which are in the liquid state, via the first sub-pixel region solution supply unit and the second sub-pixel region solution supply unit, respectively.

A third-color emission layer raw material may be sprayed on the third sub-pixel region via the nozzle unit, whereby the third-color emission layer is formed in the third sub-pixel region.

The spraying the third-color emission layer raw material may include fixing the substrate; and moving the nozzle unit along another direction of the substrate and concurrently spraying the third-color emission layer raw material on the third sub-pixel region in which the third-color emission layer is formed.

The first-color emission layer may include a red emission layer, the second-color emission layer may include a green emission layer; and the third-color emission layer may include a blue emission layer.

The liquid emission layer raw material may include nanometer-size particles.

The second electrode may be formed by spraying a second electrode raw material on the substrate via the nozzle unit having a power applied thereto.

The second electrode raw material that is sprayed may have nanometer-size particles.

The organic layer may further include at least one layer of a hole injection layer (HIL), a hole transport layer (HTL), an electron transport layer (ETL), or an electron injection layer (EIL), and the at least one layer may be formed by spraying a corresponding raw material.

The at least one layer may include the HIL or the HTL, and a hole injection layer raw material or a hole transport layer raw material may be coated on a substantially entire surface of the substrate by using a slit coater.

The at least one layer may include the ETL, and an electron transport layer raw material having a nanometer size may be sprayed on the substrate via the nozzle unit having a power applied thereto.

According to another aspect of embodiments according to the present invention, there is provided an organic light-emitting display device including a substrate; a thin film transistor (TFT) on the substrate; a pixel defining layer (PDL) on the TFT; and an organic light emitting diode (OLED) including a first electrode in a region that is exposed by patterning the PDL, an organic layer having a respective one of a plurality of emission layers (EMLs), and a second electrode, wherein the plurality of EMLs are formed respectively in a sub-pixel region with one color and other sub-pixel regions with other colors that are formed by patterning the PDL, and a solution supply unit that communicates with the sub-pixel region with one color is on the substrate.

The plurality of EMLs may include a first-color emission layer, a second-color emission layer, and a third-color emission layer, the first-color emission layer may be in a first sub-pixel region and the first sub-pixel region may communicate with a first sub-pixel region solution supply unit, the second-color emission layer may be in a second sub-pixel region and the second sub-pixel region may communicate with a second sub-pixel region solution supply unit, the third-color emission layer may be in a third sub-pixel region.

A plurality of the first sub-pixel regions, a plurality of second sub-pixel regions, and a plurality of the third sub-pixel regions may be alternately formed along one direction of the substrate, the first sub-pixel region solution supply unit and the second sub-pixel region solution supply unit may be on side ends of the substrate, all of the plurality of the first sub-pixel regions may communicate with the first sub-pixel region solution supply unit, and all of the plurality of the second sub-pixel regions may communicate with the second sub-pixel region solution supply unit.

The first sub-pixel region solution supply unit and the second sub-pixel region solution supply unit may be formed in a stripe shape along one direction of the substrate, and the plurality of the first sub-pixel regions and the plurality of the second sub-pixel regions may be formed in a direction crossing the first sub-pixel region solution supply unit and the second sub-pixel region solution supply unit, respectively.

The first-color emission layer may include a red emission layer, the second-color emission layer may include a green emission layer; and the third-color emission layer may include a blue emission layer.

The first-color emission layer and the second-color emission layer may include nanometer-size particles.

The organic layer may further include at least one layer of a hole injection layer (HIL), a hole transport layer (HTL), an electron transport layer (ETL), or an electron injection layer (EIL).

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
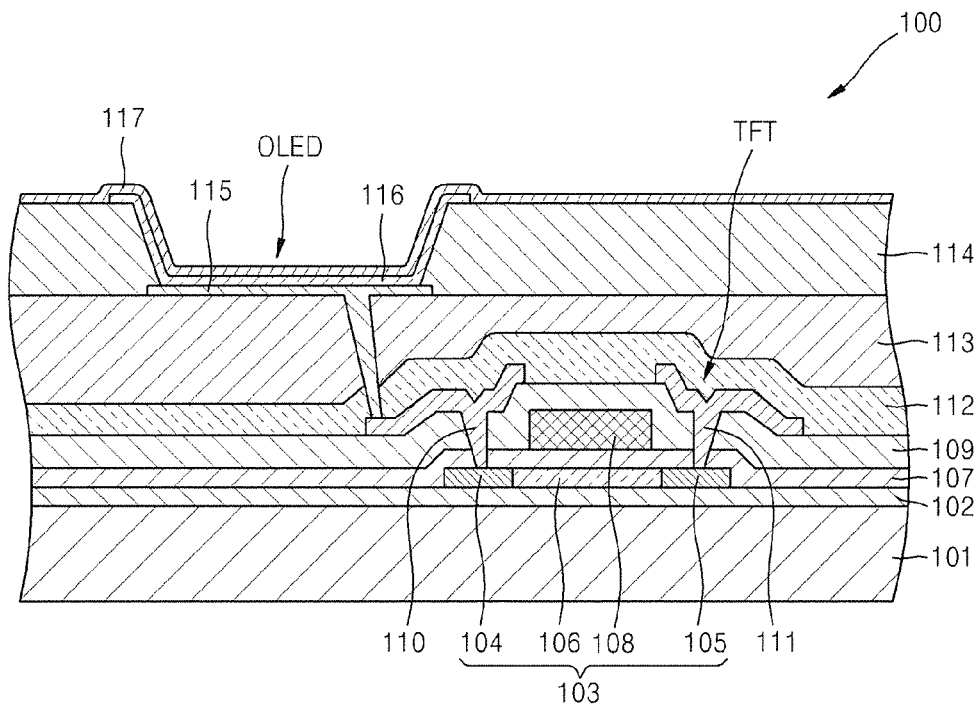
FIG. 1 is a diagram illustrating an example of a sub-pixel of an organic light-emitting display device according to an embodiment of the present invention.

The present invention will now be described more fully with reference to the accompanying drawings, in which exemplary embodiments of the invention are shown. The invention may, however, be embodied in many different forms, and should not be construed as being limited to the embodiments set forth herein. Thus, the invention may include all revisions, equivalents, or substitutions which are included in the concept and the technical scope related to the invention. In the description of embodiments of the present invention, certain detailed explanations of related art may be omitted when it is deemed that they may unnecessarily obscure the essence of the invention.

While such terms as "first," "second," etc., may be used to describe various components, such components should not be limited to the above terms. The above terms are generally used to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, the present invention will be described in detail by explaining exemplary embodiments of the invention with reference to the attached drawings. Like reference numerals in the drawings denote like elements.

Expressions such as "at least one of," when preceding a list of elements, modify the entire list of elements and do not modify the individual elements of the list.

Figure 2:
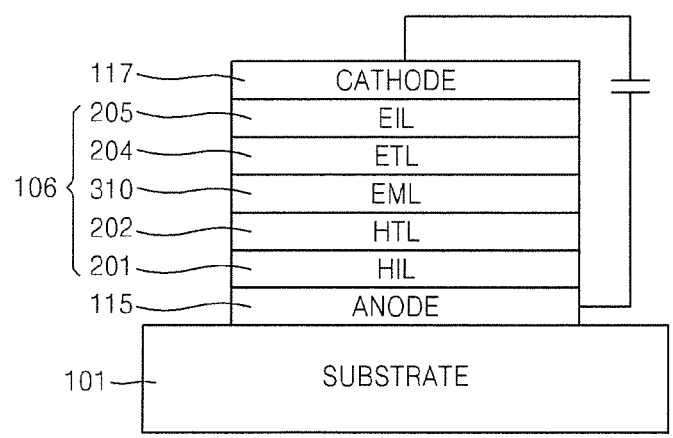
FIG. 2 illustrates an organic light emitting diode (OLED) of FIG. 1.

FIG. 1 is a diagram illustrating an example of a sub-pixel of an organic light-emitting display device 100 according to an embodiment of the present invention. FIG. 2 illustrates an organic light emitting diode (OLED) of FIG. 1.

Here, the sub-pixel has at least one thin film transistor (TFT), and the OLED. A structure of the TFT is not limited to a structure shown in FIG. 1, and the number and structure of the TFT may vary.

Referring to FIGS. 1 and 2, the organic light-emitting display device 100 includes a first substrate 101. The first substrate 101 may be formed as an insulating substrate formed of a glass, plastic, and/or the like.

A buffer layer 102 is formed on the first substrate 101. The buffer layer 102 has a structure in which an organic material or an inorganic material is layered, or the organic material and the inorganic material are alternately stacked. The buffer layer 102 functions to block oxygen and moistures and to prevent moisture or foreign substances, which are generated from the first substrate 101, from being diffused to the OLED.

A semiconductor active layer 103 having a pattern (e.g., predetermined pattern) is formed on the buffer layer 102. When the semiconductor active layer 103 is to be formed of polysilicon, first, amorphous silicon may be formed and then may be crystallized to be changed into the polysilicon.

In order to crystallize amorphous silicon, various methods such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or the like, may be used.

In the semiconductor active layer 103, a source region 104 and a drain region 105 that are obtained by doping N-type or P-type ions (or impurities), are formed. A region between the source region 104 and the drain region 105 corresponds to a channel region 106 in which none of impurities is doped.

A gate insulating layer 107 is deposited on the semiconductor active layer 103. The gate insulating layer 107 is formed as a single layer formed of $SiO_2$ or is formed as a double-layer formed of $SiO_2$ and $SiN_x$.

A gate electrode 108 is formed on a region (e.g., predetermined region) of the gate insulating layer 107. The gate electrode 108 is electrically coupled (e.g., connected) to a gate line (not shown) for applying a TFT-on signal or a TFT-off signal. The gate electrode 108 may be formed of a single metal material or a plurality of metal materials, and may be formed as a single layer including Mo, MoW, Cr, Al, an Al alloy, Mg, Al, Ni, W, or Au, or a multi-layer including a composition or combinations thereof.

An interlayer insulating layer 109 is formed on the gate electrode 108. A source electrode 110 is electrically coupled to the source region 104 via a contact hole, and a drain electrode 111 is electrically coupled to the drain region 105 via another contact hole.

A passivation layer 112 formed of $SiO_2$, $SiN_x$ or the like is formed on the source electrode 110 and the drain electrode 111. A planarization layer 113 formed of an organic material such as acryl, polyimide, or benzocyclobutene (BCB), is formed on the passivation layer 112.

A first electrode 115 is formed on the planarization layer 113. A portion of the first electrode 115 is covered by a pixel defining layer (PDL) 114 that is an insulating layer formed of an organic material, and the rest of the first electrode 115 is exposed. The first electrode 115 is electrically coupled to the source electrode 110 or the drain electrode 111.

An organic layer 116 is formed on a region of the first electrode 115, which is exposed by etching a portion of the PDL 114. A second electrode 117 is formed on the organic layer 116.

The first electrode 115 and the second electrode 117 are insulated from each other by the organic layer 116. Voltages having different polarities are applied to the first electrode 115 and the second electrode 117 so as to allow light emission to occur in the organic layer 116

The OLED displays image information (e.g., predetermined image information) by emitting one of red, green, and blue rays according to a flow of a current. The OLED includes the first electrode 115 that is electrically coupled to the source electrode 110 or the drain electrode 111, and receives a positive power therefrom, the second electrode 117 that is arranged to cover an entire pixel and receives a negative power, and the organic layer 116 that is disposed between the first electrode 115 and the second electrode 117 and emits light. Here, the first electrode 115 functions as an anode and the second electrode 117 functions as a cathode. However, the present invention is not limited thereto, and polarities of the first electrode 115 and the second electrode 117 may be switched.

The first electrode 115 may be formed as a transparent electrode or a reflective electrode.

When the first electrode 115 is used as the transparent electrode, the first electrode 115 may include, for example, ITO, IZO, ZnO, or $In_2O_3$, and when the first electrode 115 is used as the reflective electrode, the first electrode 115 may be formed in a manner that a reflective layer is formed of a material selected from the group consisting of Ag, Mg, Al, Pt, Pd, Au, Ni, Nd, Ir, Cr, and a composition or combinations thereof, and then ITO, IZO, ZnO, or $In_2O_3$ may be formed thereon.

The second electrode 117 may be formed as a transparent electrode or a reflective electrode.

When the second electrode 117 is used as the transparent electrode, the second electrode 117 may be formed in a manner that metal having a small work function and including a material selected from the group consisting of Li, Ca, LiF/Ca, LiF/Al, Al, Ag, Mg, and a composition or combinations thereof, is formed toward the organic layer 116. Then an auxiliary electrode layer may be formed thereon by using a transparent electrode forming material, or a bus electrode line may be formed thereon.

When the second electrode 117 is used as the reflective electrode, a material selected from the group consisting of Li, Ca, LiF/Ca, LiF/Al, Al, Ag, Mg, and a composition or combinations thereof may be formed on an entire surface.

When the first electrode 115 is formed as the transparent electrode or the reflective electrode, the first electrode 115 may have a shape corresponding to an opening of each sub-pixel. The second electrode 117 that is formed as the transparent electrode or the reflective electrode may be formed on an entire region of a display area. However, it is not necessary to form the second electrode 117 on the entire region, thus, the second electrode 117 may be formed by using various patterns. Here, the present invention is not limited to the present embodiment, and positions of the first electrode 115 and the second electrode 117 may be switched with each other.

The organic layer 116 may be formed of a low-molecule organic layer or a polymer organic layer.

In a case where the low-molecule organic layer is used, as illustrated in FIG. 2, the organic layer 116 may have a single-layer or multiple-layer (e.g., multi-layer) structure in which a hole injection layer (HIL) 201, a hole transport layer (HTL) 202, an emission layer (EML) 310, an electron transport layer (ETL) 204, an electron injection layer (EIL) 205, and/or the like are stacked. In a case where the polymer organic layer is used, in general, the organic layer 116 may include an HTL and an EML.

However, the structure of the organic layer 116 according to the embodiments of the present invention, is not limited thereto and thus may vary.

A second substrate may be further formed on the OLED. The second substrate may be formed of a glass substrate or a flexible substrate, or may be formed by coating an insulating material.

Figure 3:
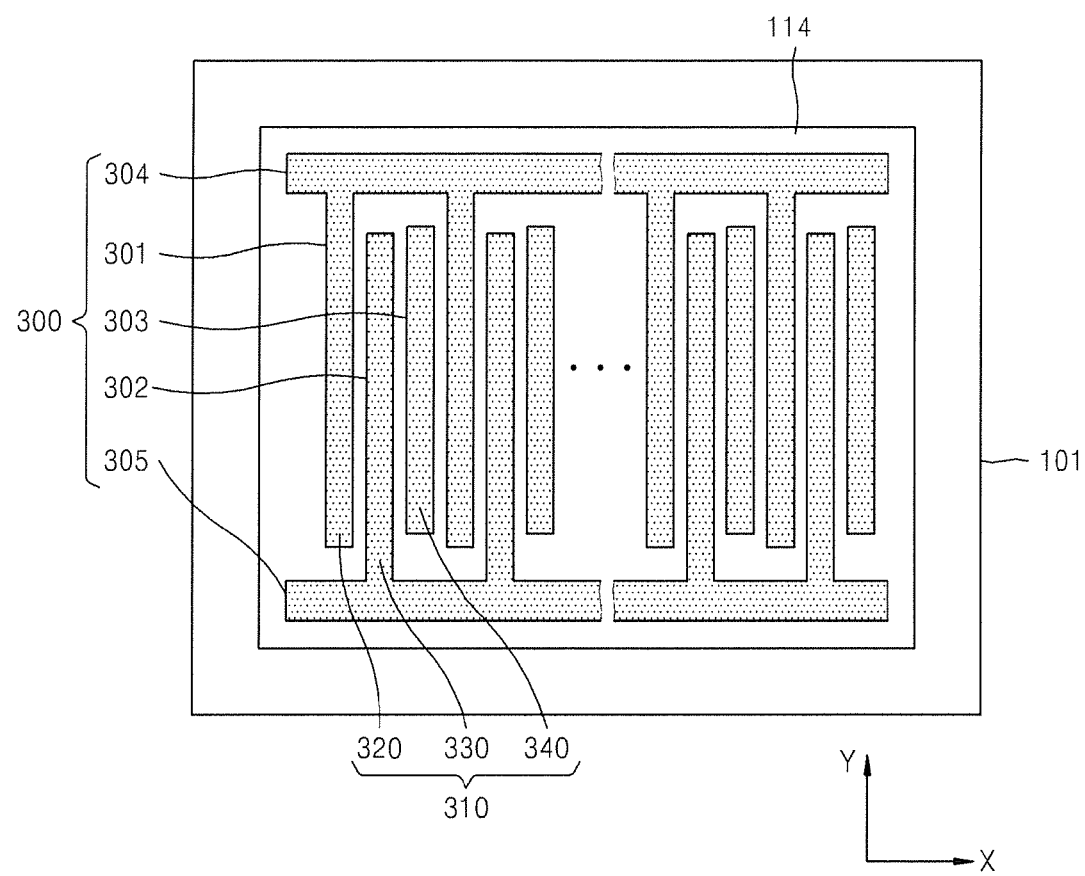
FIG. 3 illustrates a pattern structure of a sub-pixel region of the organic light-emitting display device of FIG. 1.

FIG. 3 illustrates a pattern structure of a sub-pixel region 300 of the organic light-emitting display device 100 of FIG. 1.

Referring to FIG. 3, the sub-pixel region 300 is formed on the first substrate 101 by patterning the PDL 114. The sub-pixel region 300 has a plurality of patterns according to emission colors.

According to the present embodiment, the sub-pixel region 300 includes a red sub-pixel region 301, a green sub-pixel region 302, and a blue sub-pixel region 303.

The red sub-pixel region 301, the green sub-pixel region 302, and the blue sub-pixel region 303 may be formed by boring (e.g., forming openings in) the PDL 114.

A red emission layer 320 that is a first emission layer is formed in the red sub-pixel region 301, a green emission layer 330 that is a second emission layer is formed in the green sub-pixel region 302, and a blue emission layer 340 that is a third emission layer is formed in the blue sub-pixel region 303.

Although not illustrated, the first electrode 115 may be patterned for each of the red sub-pixel region 301, the green sub-pixel region 302, and the blue sub-pixel region 303 below the red emission layer 320, the green emission layer 330, and the blue emission layer 340, respectively.

Also, the HIL 201 and the HTL 202 may be formed between the first electrode 115 and the EML 310, and the ETL 204 and the EIL 205 may be formed on the EML 310.

The second electrode 117 may be formed on an outermost layer of the EML 310.

Here, the red sub-pixel region 301, the green sub-pixel region 302, and the blue sub-pixel region 303 are alternately formed along one direction (i.e., an X-axis direction) of the first substrate 101. Accordingly, the red emission layer 320, the green emission layer 330, and the blue emission layer 340 are alternately formed in the red sub-pixel region 301, the green sub-pixel region 302, and the blue sub-pixel region 303, respectively, along the one direction of the first substrate 101.

Here, a solution supply unit for red sub-pixel region 304 and a solution supply unit for green sub-pixel region 305 that communicate with the red sub-pixel region 301 and the green sub-pixel region 302 are formed at side ends (i.e., side ends along a Y-axis direction) of the first substrate 101.

That is, the solution supply unit for red sub-pixel region 304 is formed on one side of the first substrate 101, and the solution supply unit for green sub-pixel region 305 facing the solution supply unit for red sub-pixel region 304 is formed on the other side of first substrate 101.

The solution supply unit for red sub-pixel region 304 and the solution supply unit for green sub-pixel region 305 extend in one direction (i.e., the X-axis direction) of the first substrate 101. The solution supply unit for red sub-pixel region 304 and the solution supply unit for green sub-pixel region 305 may be formed by boring (e.g., forming openings in) a portion of the PDL 114.

The solution supply unit for red sub-pixel region 304 communicates with the red sub-pixel region 301 in which the red emission layer 320 is formed, and the solution supply unit for green sub-pixel region 305 communicates with the green sub-pixel region 302 in which the green emission layer 330 is formed.

For the communication, an end of the red sub-pixel region 301 that is pattered on the first substrate 101 may be connected to the solution supply unit for red sub-pixel region 304 in the Y-direction. The red sub-pixel region 301 and the solution supply unit for red sub-pixel region 304 may be patterned (e.g., arranged) in a direction crossing each other.

Also, an end of the green sub-pixel region 302 may be connected to the solution supply unit for green sub-pixel region 305 in the Y-direction. The green sub-pixel region 302 and the solution supply unit for green sub-pixel region 305 may be arranged in a direction crossing each other.

Here, in order to form each of the red emission layer 320 and the green emission layer 330, a red emission layer raw material and a green emission layer raw material may be supplied to the red sub-pixel region 301 and the green sub-pixel region 302, respectively, via the solution supply unit for red sub-pixel region 304 and the solution supply unit for green sub-pixel region 305, by performing an electrostatic spraying method using a nozzle device.

This will now be described in detail.

Figure 4:
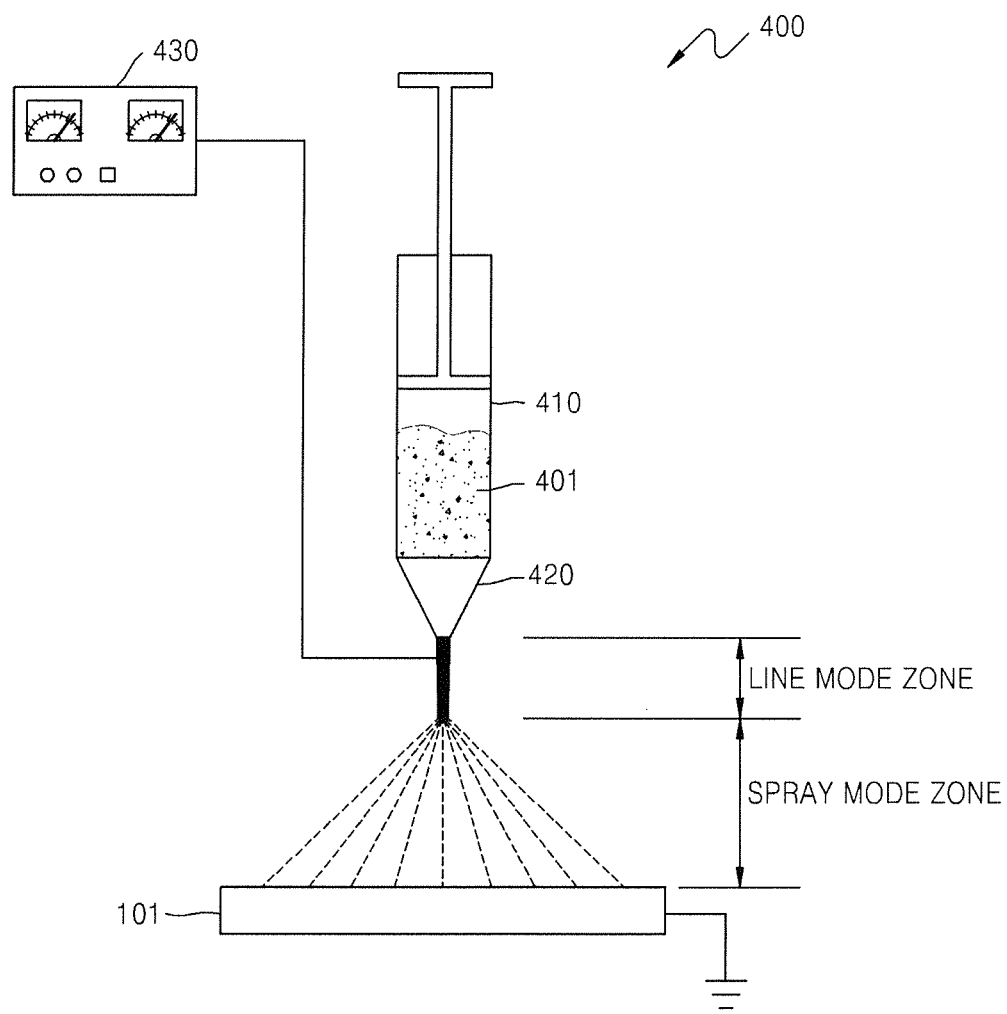
FIG. 4 is a diagram illustrating a nozzle device, according to an embodiment of the present invention.
Figure 5:
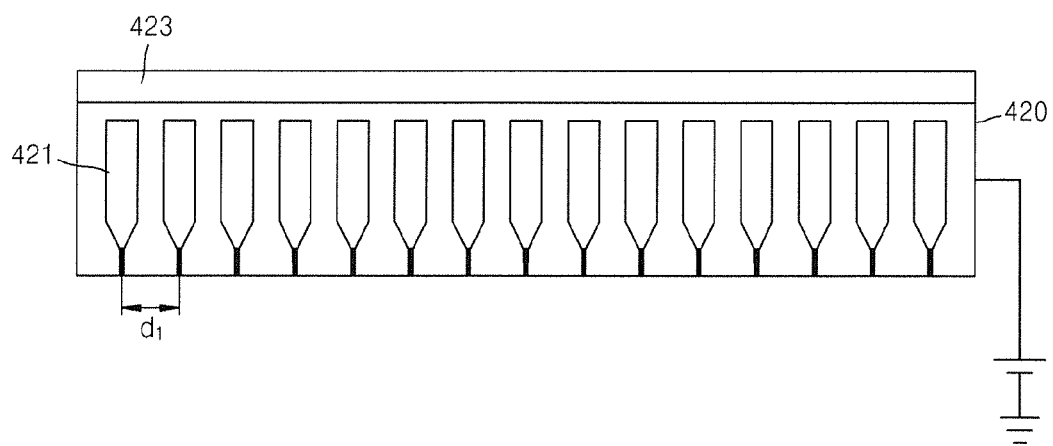
FIG. 5 is a diagram illustrating a nozzle unit of the nozzle device of FIG. 4.
Figure 6:
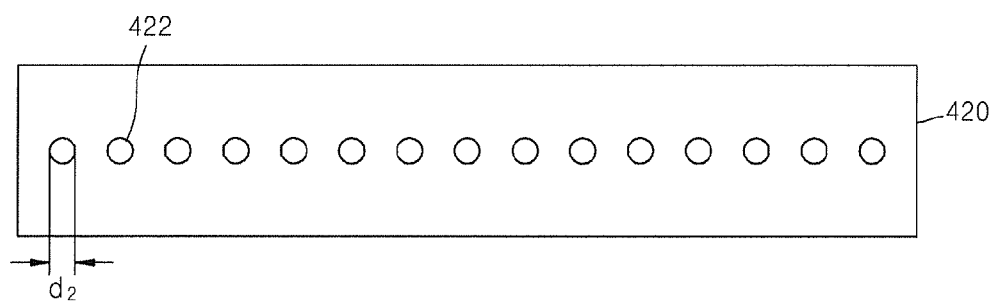
FIG. 6 is a bottom view of the nozzle unit of FIG. 5.
Figure 7:
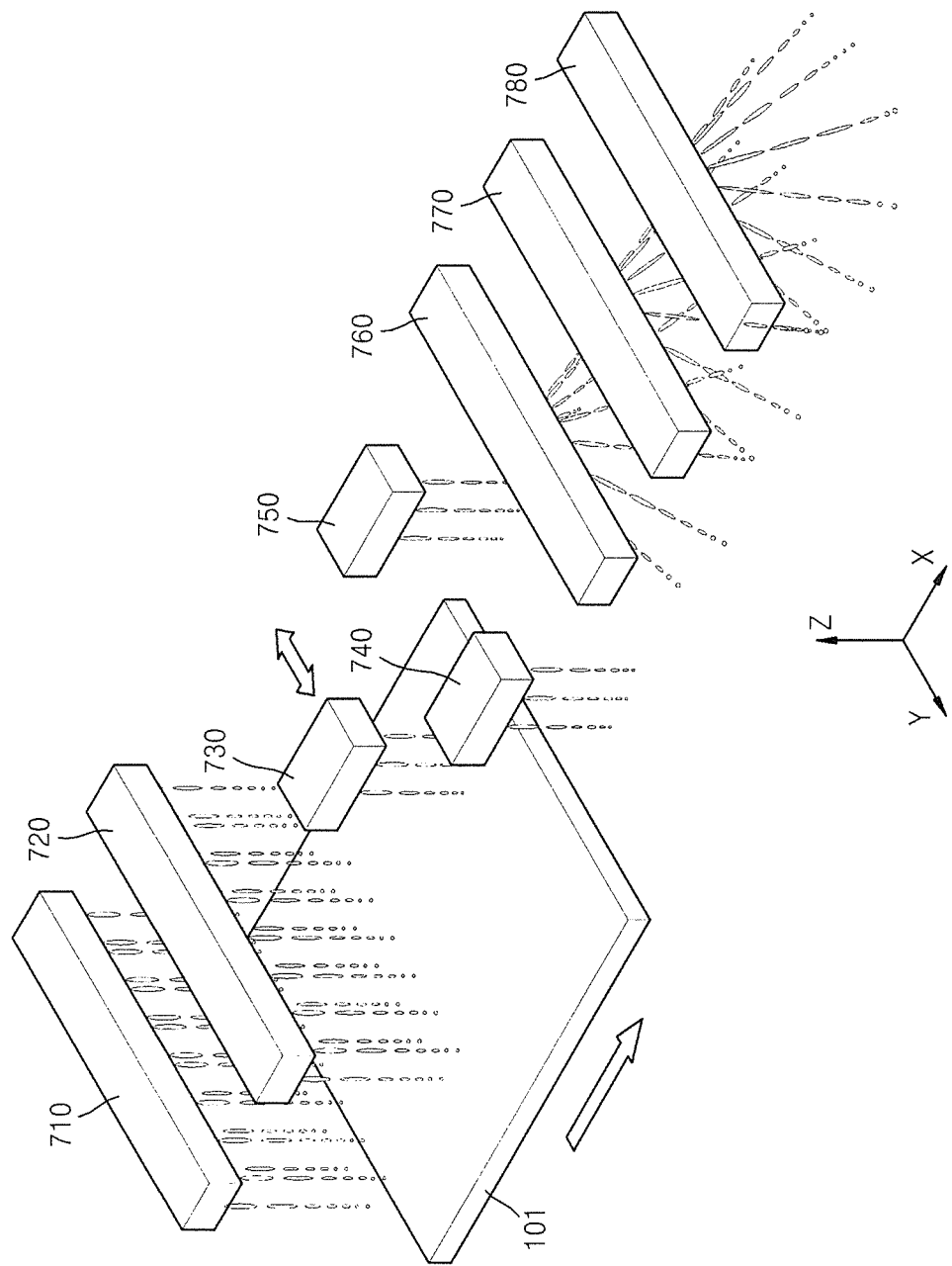
FIG. 7 illustrates processes for manufacturing layers of the OLED of FIG. 1.

FIG. 4 is a diagram illustrating a nozzle device 400, according to an embodiment of the present invention. FIG. 5 is a diagram illustrating a nozzle unit 420 of the nozzle device 400 of FIG. 4. FIG. 6 is a bottom view of the nozzle unit 420 of FIG. 5.

Referring to FIGS. 4 through 6, the nozzle device 400 includes a main-body unit (e.g., main body) 410 that stores an emission layer raw material 401. The nozzle unit 420 is mounted at an end of the main-body unit 410. The nozzle unit 420 may be a multi-nozzle (e.g., may include multiple nozzles) but a type of the nozzle unit 420 is not limited thereto. In the nozzle unit 420, a plurality of nozzles 421 are arranged at regular intervals. In one embodiment, a distance d1 between the nozzles 421 may be between 200 μm and 450 μm. In one embodiment, a diameter d2 of a spray opening 422 of the nozzle 421 may be between 50 μm and 150 μm.

A nozzle cover 423 is formed on the nozzle unit 420, and when the nozzle cover 423 is open, the emission layer raw material 401 in a liquid state may be concurrently (e.g., simultaneously) supplied to the nozzles 421. The emission layer raw material 401 moves along an internal path of each nozzle 421 having a capillary tube shape, and then is sprayed on the first substrate 101 via the spray opening 422.

Here, power (e.g., a predetermined power) is applied to the nozzle unit 420, so that the emission layer raw material 401 in the liquid state is sprayed on a desired region of the first substrate 101 by the electrostatic spraying method. For this, the nozzle unit 420 is formed of a material such as aluminum, copper, platinum, gold, silver, SUS, and/or the like, that has conductivity.

Also, a power supply unit 430 (e.g., power supply) is coupled to the nozzle unit 420. When the nozzle unit 420 receives power from the power supply unit 430, the nozzle unit 420 may positively charge the emission layer raw material 401 in the liquid state while the emission layer raw material 401 is sprayed via the spray opening 422. Here, a positive voltage is applied to all of the nozzles 421. Also, the first substrate 101 is electrically coupled to a ground voltage source.

Accordingly, when the emission layer raw material 401 in the liquid state that is positively charged is sprayed on a desired region of the first substrate 101 via the spray opening 422 of each nozzle 421, a repulsive force acts between the emission layer raw materials 401. Thus, the emission layer raw materials 401 do not collide with each other but repel each other.

A power having a voltage between 50V and 5 KV may be applied from the power supply unit 430 to the nozzle device 400, and in this regard, the nozzle device 400 may divide a dispensing mode into a line mode zone and a spray mode zone according to a strength of the applied power and may spray the emission layer raw materials 401. For example, when the strength of the applied power is reduced, the nozzle device 400 may spray the emission layer raw materials 401 in the line mode zone, and when the strength of the applied power is increased, the nozzle device 400 may spray the emission layer raw materials 401 in the spray mode zone.

A method of manufacturing the OLED of the organic light-emitting display device 100 according to the present embodiment will now be described with reference to FIGS. 1 through 7.

Here, in order to form, the red sub-pixel region 301 for forming the red emission layer 320, the solution supply unit for red sub-pixel region 304 that communicates with the red sub-pixel region 301, the green sub-pixel region 302 for forming the green emission layer 330, the solution supply unit for green sub-pixel region 305 that communicates with the green sub-pixel region 302, and the blue sub-pixel region 303 for forming the blue emission layer 340, a portion of the PDL 114 on the first substrate 101 is patterned (or removed to form openings) to have a particular shape.

The organic layer 116 is formed on an exposed portion of the patterned first electrode 115 in each of the red sub-pixel region 301, the green sub-pixel region 302, and the blue sub-pixel region 303.

First, the HIL 201 is formed on the first electrode 115 by using a slit coater for hole injection layer 710 that stores a hole injection layer raw material in a liquid state.

The HTL 202 is formed on the HIL 201 by using a slit coater for hole transport layer 720 that stores a hole transport layer raw material in a liquid state.

The HIL 201 and the HTL 202 are common layers that may not be required to be patterned, so that, the hole injection layer raw material and the hole transport layer raw material may be completely sprayed on the first substrate 101 by using the slit coater for hole injection layer 710 and the slit coater for hole transport layer 720.

Here, the slit coater for hole injection layer 710 and the slit coater for hole transport layer 720 are in a stop state. On the other hand, the first substrate 101 moves along an X-axis direction. Each of the HIL 201 and the HTL 202 may be formed to have a thickness equal to or less than 120 nm.

Afterwards, the EML 310 may be formed on the HTL 202.

In order to form the blue emission layer 340, a blue emission layer raw material is sprayed on the blue sub-pixel region 303 by using a nozzle device for blue emission layer 730.

Here, the nozzle device for blue emission layer 730 is disposed in a direction crossing the slit coater for hole injection layer 710 and the slit coater for hole transport layer 720. The nozzle device for blue emission layer 730 sprays the blue emission layer raw material in the blue sub-pixel region 303 while the nozzle device for blue emission layer 730 moves along a Y-axis direction of the first substrate 101. On the other hand, the first substrate 101 is fixed.

In order to form the red emission layer 320 and the green emission layer 330, a nozzle device for red emission layer 740 and a nozzle device for green emission layer 750 are used. Here, the nozzle device for red emission layer 740 and the nozzle device for green emission layer 750 are fixed. On the other hand, the first substrate 101 moves along the X-axis direction.

Operational principles with respect to the nozzle device for red emission layer 740 and the nozzle device for green emission layer 750 are substantially the same, thus, hereinafter, a case in which the red emission layer 320 is formed by using the nozzle device for red emission layer 740 will now be described. Also, because the manufacturing procedure for forming the green emission layer 330 by using the nozzle device for green emission layer 750 is substantially the same, detailed descriptions thereof are omitted here. Here, it is assumed that the nozzle device 400 shown in FIGS. 4 through 6 is applied to the nozzle device for red emission layer 740 of FIG. 7.

First, a positive voltage (e.g., positive voltage having a predetermined level) is applied from the power supply unit 430 to the nozzle unit 420. Here, the first substrate 101 is electrically coupled to a ground voltage source. Accordingly, an electrical potential difference occurs between the nozzle unit 420 and the first substrate 101, and the red emission layer raw materials that are positively charged via the spray opening 422 of the nozzle unit 420 are sprayed to the solution supply unit for red sub-pixel region 304 via the spray openings 422 of the nozzles 421. Here, the red emission layer raw materials may be supplied in a line mode via the spray openings 422.

Because a voltage (e.g., a predetermined voltage) is applied to the red emission layer raw materials that are sprayed into the solution supply unit for red sub-pixel region 304, the red emission layer raw materials form minute droplets, each having a very small size (e.g., a nanometer size). When the minute droplets reach the inside of the solution supply unit for red sub-pixel region 304, a solvent included in the red emission layer raw materials 401 in a liquid state completely vaporizes, so that only a solute is left.

Here, because all of the red emission layer raw materials 401 are positively charged, a repulsive force acts between the red emission layer raw materials 401. Thus, the droplets by the red emission layer raw materials 401 that are sprayed into the solution supply unit for red sub-pixel region 304 repel each other and thus move to the red sub-pixel region 301 that communicates with the solution supply unit for red sub-pixel region 304. Accordingly, the red emission layer 320 is formed in the red sub-pixel region 301.

Also, the green emission layer raw materials, each having a very small size (e.g., a nanometer size), are sprayed to the solution supply unit for green sub-pixel region 305 by using the nozzle device for green emission layer 750, and then the green emission layer raw materials move to the green sub-pixel region 302 due to a repulsive force between droplets by the green emission layer raw materials, wherein the green sub-pixel region 302 communicates with the solution supply unit for green sub-pixel region 305. Accordingly, the green emission layer 330 is formed in the green sub-pixel region 302.

Next, the ETL 204 is formed on the EML 310. The ETL 204 is formed by using a nozzle device for electron transport layer 760 that stores an electron transport layer raw material.

The EIL 205 is formed on the ETL 204. The EIL 205 is formed by using a nozzle device for electron injection layer 770 that stores an electron injection layer raw material.

The ETL 204 and the EIL 205 are common layers that may not be required to be patterned, so that, the electron transport layer raw material and the electron injection layer raw material may be completely sprayed on the first substrate 101 by using the nozzle device for electron transport layer 760 and the nozzle device for electron injection layer 770.

Here, because the EML 310 is not cross-linked, a surface of the EML 310 may be dissolved by the electron transport layer raw material. Thus, an interface between the ETL 204 and the EML 310 may be intermixed, and roughness may increase, such that a characteristic of the OLED may deteriorate.

In order to prevent the deterioration, similar to a case of forming the EML 310, the ETL 204 may be formed by spraying the electron transport layer raw materials having a very small size (e.g., a nanometer size) by the electrostatic spraying method. In order to form the red emission layer 320 and the green emission layer 330, the red emission layer raw materials and the green emission layer raw materials may be sprayed to desired regions of the solution supply unit for red sub-pixel region 304 and the solution supply unit for green sub-pixel region 305, respectively, so that the nozzle device for red emission layer 740 and the nozzle device for green emission layer 750 may spray the red emission layer raw materials and the green emission layer raw materials in a line mode.

However, because the ETL 204 is not patterned and may be formed on an entire surface of the first substrate 101, the nozzle device for electron transport layer 760 may spray the electron transport layer raw materials in a spray mode by increasing a voltage. By doing so, a coating operation may be possible while a shock (or impact) to the surface of the EML 310 is reduced or minimized. Also, it is not necessary to pattern the EIL 205, thus, the electron injection layer raw materials having a very small size (e.g., a nanometer size) may be sprayed on the first substrate 101 by using the nozzle device for electron injection layer 770.

Afterwards, the second electrode 117 is formed on the EIL 205. The second electrode 117 may be formed by using a nozzle device for second electrode 780 that stores a second electrode raw material.

The second electrode 117 is a common layer that may not be required to be patterned. Thus, the second electrode raw material having a very small size (e.g., a nanometer size), such as a silver ink, may be sprayed on the first substrate 101 by using the nozzle device for second electrode 780 in a spray mode. Afterwards, in order to increase conductivity of the second electrode 117, an annealing process may be performed at a temperature about 50° C.

As described above, the HIL 201, the HTL 202, the EML 310, the ETL 204, the EIL 205, and the second electrode 117 may be manufactured together via solubility processes using the nozzle devices that store liquid raw materials.

According to the organic light-emitting display device and the method of manufacturing the organic light-emitting display device, when the OLED is formed, the organic layer, the cathode, or the like may be manufactured together via the solubility processes, so that a deposition process may be omitted.

Also, because the OLED is manufactured via the solubility process, a large substrate may be manufactured, so that the productivity may be improved and the manufacturing costs may be reduced.

Also, because complicated equipment such as a vacuum apparatus for the deposition process is not necessary and the manufacturing procedure is performed in an atmosphere environment, the manufacturing procedure may be simplified, and an in-line based system may be formed.

Also, because commercially available mother glasses may be used or mother glasses may be produced in large scale with relative ease, the manufacturing costs may be saved.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing an organic light-emitting display device, the method comprising:
    forming a plurality of thin film transistors (TFTs) on a substrate;
    forming a plurality of organic light emitting diodes (OLEDs), each of the OLEDs comprising a first electrode having a portion exposed by a pixel defining layer (PDL) on the TFTs, an organic layer on the exposed portion of the first electrode and comprising an emission layer (EML) configured to emit light having at least one of a plurality of colors, and a second electrode on the organic layer;
    forming the EML in each of a sub-pixel region with one color and other sub-pixel regions with other colors, the sub-pixel regions being formed by forming openings in the PDL;
    forming a solution supply unit in the PDL that fluidly communicates with the sub-pixel region with one color; and
    supplying emission layer raw materials for the plurality of colors to the sub-pixel region with one color and the other sub-pixel regions with other colors via the solution supply unit, thereby forming the EML.

2. The method of claim 1, wherein at least one of the emission layer raw materials is sprayed into the solution supply unit via a nozzle unit having a power applied thereto, and
    the at least one of the emission layer raw materials moves to the sub-pixel region that communicates with the solution supply unit, whereby the EML is formed.

3. The method of claim 2, wherein the EML is formed by charging the at least one of the emission layer raw materials comprising a liquid emission layer raw material; and
    forming droplets by spraying the charged liquid emission layer raw material via the nozzle unit, and then forming the EML via the solution supply unit.

4. The method of claim 3, wherein the charging of the liquid emission layer raw material comprises applying an electrical potential difference to the liquid emission layer raw material.

5. The method of claim 4, wherein a positive voltage is applied to the nozzle unit, whereby the liquid emission layer raw material is positively charged and then is sprayed via the nozzle unit, and the substrate is electrically coupled to a ground voltage source.

6. A method of manufacturing an organic light-emitting display device, the method comprising:
forming a plurality of thin film transistors (TFTs) on a substrate; and
forming a plurality of organic light emitting diodes (OLEDs), each of the OLEDs comprising a first electrode having a portion exposed by a pixel defining layer (PDL) on the TFTs, an organic layer on the exposed portion of the first electrode and comprising an emission layer (EML) configured to emit light having at least one of a plurality of colors, and a second electrode on the organic layer,
wherein the EML is formed in each of a sub-pixel region with one color and other subpixel regions with other colors, the sub-pixel regions being formed by forming openings in the PDL,
wherein a solution supply unit that communicates with the sub-pixel region with one color is formed in the sub-pixel region with one color,
wherein emission layer raw materials for the plurality of colors are supplied to the subpixel region with one color and the other sub-pixel regions with other colors via the solution supply unit, whereby the EML is formed,
wherein at least one of the emission layer raw materials is sprayed into the solution supply unit via a nozzle unit having a power applied thereto,
wherein the at least one of the emission layer raw materials moves to the sub-pixel region that communicates with the solution supply unit, whereby the EML is formed,
wherein the EML is formed by charging the at least one of the emission layer raw materials comprising a liquid emission layer raw material,
wherein droplets are formed by spraying the charged liquid emission layer raw material via the nozzle unit, and then forming the EML via the solution supply unit,
wherein the EML comprises a first-color emission layer, a second-color emission layer, and a third-color emission layer,
wherein the first-color emission layer is formed in a first sub-pixel region of the sub-pixel regions, and the first sub-pixel region communicates with a first sub-pixel region solution supply unit,
wherein, the second-color emission layer is formed in a second sub-pixel region of the sub-pixel regions, and the second sub-pixel region communicates with a second sub-pixel region solution supply unit,
wherein the third-color emission layer is formed in a third sub-pixel region of the subpixel regions, and
wherein a first-color emission layer raw material and a second-color emission layer raw material, from among the emission layer raw materials, that are in a liquid state and are charged are sprayed via the first sub-pixel region solution supply unit and the second sub-pixel region solution supply unit, respectively, move to the first sub-pixel region and the second sub-pixel region, respectively, due to a repulsive force, and then form the first-color emission layer and the second-color emission layer, respectively.

7. The method of claim 6, wherein a plurality of the first sub-pixel regions, a plurality of the second sub-pixel regions, and a plurality of the third sub-pixel regions, from among the sub-pixel regions, are alternately formed along one direction of the substrate, the first sub-pixel region solution supply unit and the second sub-pixel region solution supply unit are formed on side ends of the substrate,
all of the plurality of the first sub-pixel regions communicate with the first sub-pixel region solution supply unit, and
all of the plurality of the second sub-pixel regions communicate with the second subpixel region solution supply unit.

8. The method of claim 6, wherein the first sub-pixel region solution supply unit and the second sub-pixel region solution supply unit extend along one direction of the substrate, and
the plurality of the first sub-pixel regions and the plurality of the second sub-pixel regions are formed in a direction crossing the first sub-pixel region solution supply unit and the second sub-pixel region solution supply, respectively.

9. The method of claim 6, wherein the spraying of the first-color emission layer raw material and the second-color emission layer raw material comprises:
fixing the nozzle unit having a power applied thereto; and
moving the substrate along one direction and concurrently spraying the first-color emission layer raw material and the second-color emission layer raw material, which are in the liquid state, via the first sub-pixel region solution supply unit and the second sub-pixel region solution supply unit, respectively.

10. The method of claim 6, wherein a third-color emission layer raw material from among the emission layer raw materials is sprayed on the third sub-pixel region via the nozzle unit, whereby the third-color emission layer is formed in the third sub-pixel region.

11. The method of claim 10, wherein the spraying of the third-color emission layer raw material comprises:
fixing the substrate; and
moving the nozzle unit along another direction of the substrate and concurrently spraying the third-color emission layer raw material on the third sub-pixel region in which the third-color emission layer is formed.

12. The method of claim 6, wherein the first-color emission layer comprises a red emission layer,
the second-color emission layer comprises a green emission layer; and
the third-color emission layer comprises a blue emission layer.

13. The method of claim 3, wherein the liquid emission layer raw material comprises nanometer-size particles.

14. The method of claim 1, wherein the second electrode is formed by spraying a second electrode raw material on the substrate via a nozzle unit having a power applied thereto.

15. The method of claim 14, wherein the second electrode raw material comprises nanometer-size particles.

16. The method of claim 1, wherein the organic layer further comprises at least one layer of a hole injection layer (HIL), a hole transport layer (HTL), an electron transport layer (ETL), or an electron injection layer (EIL), and
the at least one layer is formed by spraying a corresponding raw material.

17. The method of claim 16, wherein the at least one layer comprises the HIL or the HTL, and
a hole injection layer raw material or a hole transport layer raw material is coated on a substantially entire surface of the substrate by using a slit coater.

18. The method of claim 16, wherein the at least one layer comprises the ETL, and an electron transport layer raw material having a nanometer size is sprayed on the substrate via a nozzle unit having a power applied thereto.

\* \* \* \* \*